(12) United States Patent
Shih (10) Patent No.: US 9,613,895 B1
(45) Date of Patent: Apr. 4, 2017

(54) SEMICONDUCTOR PACKAGE WITH DOUBLE SIDE MOLDING

(71) Applicant: INOTERA MEMORIES, INC., Taoyuan (TW)

(72) Inventor: Shing-Yih Shih, New Taipei (TW)

(73) Assignee: INOTERA MEMORIES, INC., Taoyuan (TW)

(*) Notice: Subject to any disclaimer, the term of this patent is extended or adjusted under 35 U.S.C. 154(b) by 0 days.

(21) Appl. No.: 15/060,577

(22) Filed: Mar. 3, 2016

(51) Int. Cl.
*H01L 23/49* (2006.01)
*H01L 23/498* (2006.01)
*H01L 23/31* (2006.01)
*H01L 23/00* (2006.01)

(52) U.S. Cl.
CPC .... *H01L 23/49838* (2013.01); *H01L 23/3135* (2013.01); *H01L 23/3171* (2013.01); *H01L 23/49816* (2013.01); *H01L 24/29* (2013.01); *H01L 2224/29124* (2013.01); *H01L 2224/29147* (2013.01); *H01L 2224/29166* (2013.01); *H01L 2224/29184* (2013.01)

(58) Field of Classification Search
CPC ................................ H01L 23/49816
USPC ........................................... 257/738
See application file for complete search history.

(56) References Cited

U.S. PATENT DOCUMENTS

| 2014/0077364 A1* | 3/2014 | Marimuthu | H01L 23/5389 257/737 |
| 2015/0303173 A1* | 10/2015 | Maydar | H01L 23/49827 257/664 |

* cited by examiner

*Primary Examiner* — Kenneth Parker
*Assistant Examiner* — Warren H Kilpatrick
(74) *Attorney, Agent, or Firm* — Winston Hsu; Scott Margo (57) ABSTRACT

A semiconductor package includes an RDL interposer having a first side, a second side, and a vertical sidewall extending between the first side and the second side; at least one semiconductor die mounted on the first side of the RDL interposer; a first molding compound disposed on the first side covering the at least one semiconductor die; a plurality of solder bumps or solder balls mounted on the second side; and a second molding compound disposed on the second side surrounding the plurality of solder bumps or solder balls and covering the vertical sidewall of the RDL interposer.

8 Claims, 11 Drawing Sheets

SEMICONDUCTOR PACKAGE WITH DOUBLE SIDE MOLDING

BACKGROUND OF THE INVENTION

1. Field of the Invention

The present invention relates generally to the field of semiconductor packaging. More particularly, the present invention relates to a semiconductor package with double side molding and a method for manufacturing the same.

2. Description of the Prior Art

The semiconductor technologies are developing very fast, and especially semiconductor dies have a tendency toward miniaturization. However, the requirements for the functions of the semiconductor dies have an opposite tendency to variety. Namely, the semiconductor dies must have more I/O pads into a smaller area, so the density of the pins is raised quickly. It causes the packaging for the semiconductor dies to become more difficult.

The main purpose of the package structure is to protect the dies from outside damages. Furthermore, the heat generated by the dies must be diffused efficiently through the package structure to ensure the operation the dies.

As known in the art, wafer level package (WLP) packages the dies on a wafer before dividing the dies into respective dies. The WLP technology has some advantages, such as a shorter producing cycle time and lower cost. Fan-out wafer-level packaging (FOWLP) is a packaging process in which contacts of a semiconductor die are redistributed over a larger area through a redistribution layer (RDL) that is typically formed on a substrate such as a TSV interposer.

The RDL is typically defined by the addition of metal and dielectric layers onto the surface of the wafer to re-route the I/O layout into a looser pitch footprint. Such redistribution requires thin film polymers such as BCB, PI or other organic polymers and metallization such as Al or Cu to reroute the peripheral pads to an area array configuration.

The TSV interposer is costly because fabricating the interposer substrate with TSVs is a complex process. Thus, forming FOWLP products that includes an interposer having a TSV interposer may be undesirable for certain applications.

In wafer level packaging, the wafer and the dies mounted on the wafer are typically covered with a relatively thick layer of the molding compound. The thick layer of the molding compound results in increased warping of the packaging due to coefficient of thermal expansion (CTE) mismatch, and the thickness of the packaging. It is known that wafer warpage continues to be a concern.

Warpage can prevent successful assembly of a die-to-wafer stack because of the inability to maintain the coupling of the die and wafer. Warpage issue is serious especially in a large sized wafer, and has raised an obstacle to a wafer level semiconductor packaging process that requires fine-pitch RDL process. Therefore, there remains a need in the art for an improved method of manufacturing wafer level packages.

SUMMARY OF THE INVENTION

The present invention is directed to provide an improved semiconductor package with double side molding and a fabrication method that is capable of alleviating post-molding warpage and preventing cracking of the RDL interposer.

In one aspect of the invention, a semiconductor package includes a redistributed layer (RDL) interposer having a first side, a second side opposite to the first side, and a vertical sidewall extending between the first side and the second side; at least one semiconductor die mounted on the first side of the RDL interposer; a first molding compound disposed on the first side, the first molding compound covering the at least one semiconductor die; a plurality of solder bumps or solder balls mounted on the second side; and a second molding compound disposed on the second side, the second molding compound surrounding the plurality of solder bumps or solder balls and covering the vertical sidewall of the RDL interposer.

According to one embodiment of the invention, the first molding compound is in direct contact with the second molding compound. The first molding compound and the second molding compound have different composition.

According to one embodiment of the invention, the semiconductor package further comprises bumps directly disposed on respective said plurality of solder bumps or solder balls such that said bumps protrude from a top surface of the second molding compound.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

DETAILED DESCRIPTION

In the following detailed description of the invention, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural changes may be made without departing from the scope of the present invention.

The following detailed description is, therefore, not to be taken in a limiting sense, and the scope of the present invention is defined only by the appended claims, along with the full scope of equivalents to which such claims are entitled.

One or more implementations of the present invention will now be described with reference to the attached drawings, wherein like reference numerals are used to refer to like elements throughout, and wherein the illustrated structures are not necessarily drawn to scale. The terms "die", "semiconductor chip", and "semiconductor die" are used interchangeable throughout the specification.

The terms wafer and substrate used herein include any structure having an exposed surface onto which a layer is deposited according to the present invention, for example, to form the circuit structure such as a redistribution layer (RDL). The term substrate is understood to include semiconductor wafers, but not limited thereto. The term substrate is also used to refer to semiconductor structures during processing, and may include other layers that have been fabricated thereupon.

Please refer to FIG. 1 to FIG. 12. FIG. 1 to FIG. 12 are schematic diagrams showing an exemplary method (or an RDL-first process) for fabricating a semiconductor package such as a wafer level package (WLP) with an encapsulated (or sealed) redistributed layer (RDL) interposer according to one embodiment of the invention.

Figure 1:
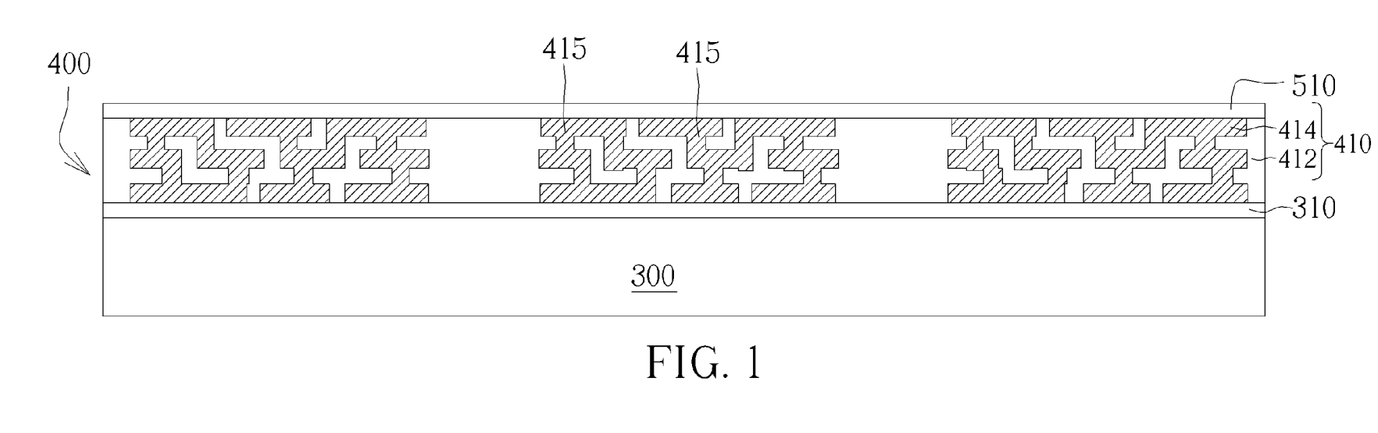
FIG. 1 to FIG. 12 are schematic diagrams showing an exemplary method for fabricating a semiconductor package with double side molding to encapsulate the RDL interposer according to one embodiment of the invention.

As shown in FIG. 1, a carrier 300 is prepared. The carrier 300 may be a releasable substrate material with an adhesive layer (not explicitly shown). At least a dielectric layer or a passivation layer 310 is then formed on a top surface of the carrier 300. The passivation layer 310 may comprise organic materials such as polyimide (PI) or inorganic materials such as silicon nitride, silicon oxide or the like. Subsequently, a redistribution layer (RDL) layer 410 is formed on the passivation layer 310.

The RDL layer 410 may comprise at least one dielectric layer 412 and at least one metal layer 414. The dielectric layer 412 may comprise organic materials such as polyimide (PI) or inorganic materials such as silicon nitride, silicon oxide or the like, but not limited thereto. The metal layer 414 may comprise aluminum, copper, tungsten, titanium, titanium nitride, or the like. According to the illustrated embodiment, the metal layer 414 may comprise a plurality of bump pads 415 exposed from a top surface of the dielectric layer 412. A passivation layer (or a dielectric layer) 510 is formed on the RDL layer 410. It is understood that the passivation layer 510 may comprise a solder mask, but is not limited thereto.

Figure 2:
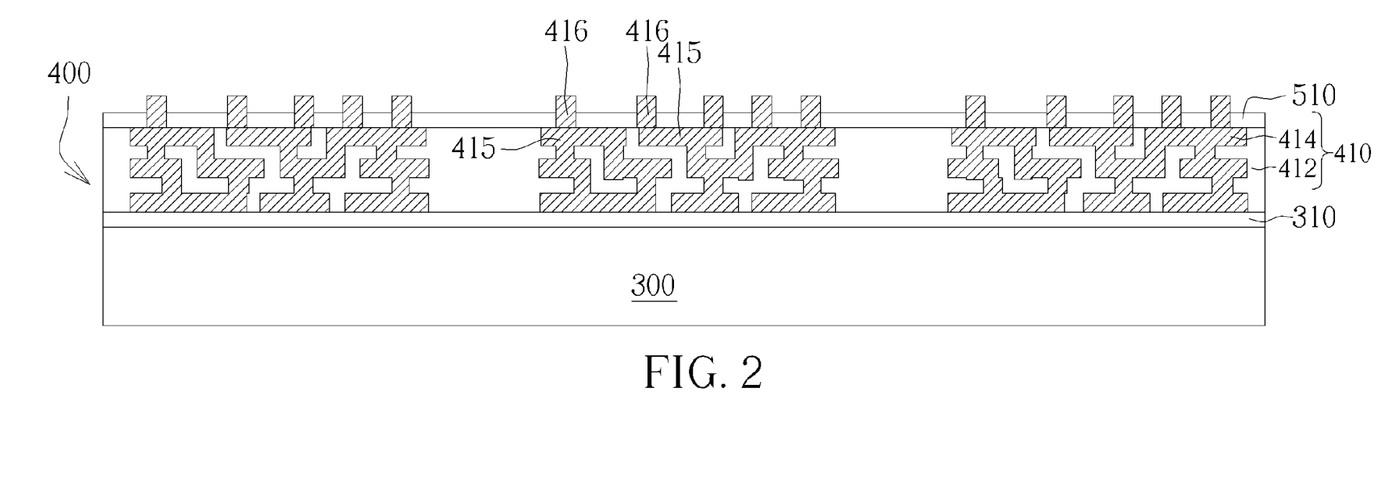

As shown in FIG. 2, a plurality of bumps 416 such as micro-bumps may be formed on the RDL layer 410 for further connections. The bumps 416 may be directly formed on respective bump pads 415 in the metal layer 414. The formation of the bumps 416 is known in the art. For example, openings may be formed in the passivation layer 510 to expose the respective bump pads 415. Optionally, an under-bump metallurgy (UBM) layer may be deposited. Thereafter, a photoresist layer defining the pattern of the bumps 416 is formed and a plating process may be carried out to form a metal bump on the UBM layer. After removing the photoresist layer, the UBM layer not covered by the metal bump is removed.

According to the embodiment, the bumps 416 may comprise copper, but is not limited thereto. In some embodiments, the bumps 416 may be solder bumps and need to be reflowed in a later stage. It is understood that other bump materials may be employed. Hereinafter, the passivation layer 310, the RDL layer 410 and the passivation layer 510 are collectively referred to as an RDL interposer 400.

Figure 3:
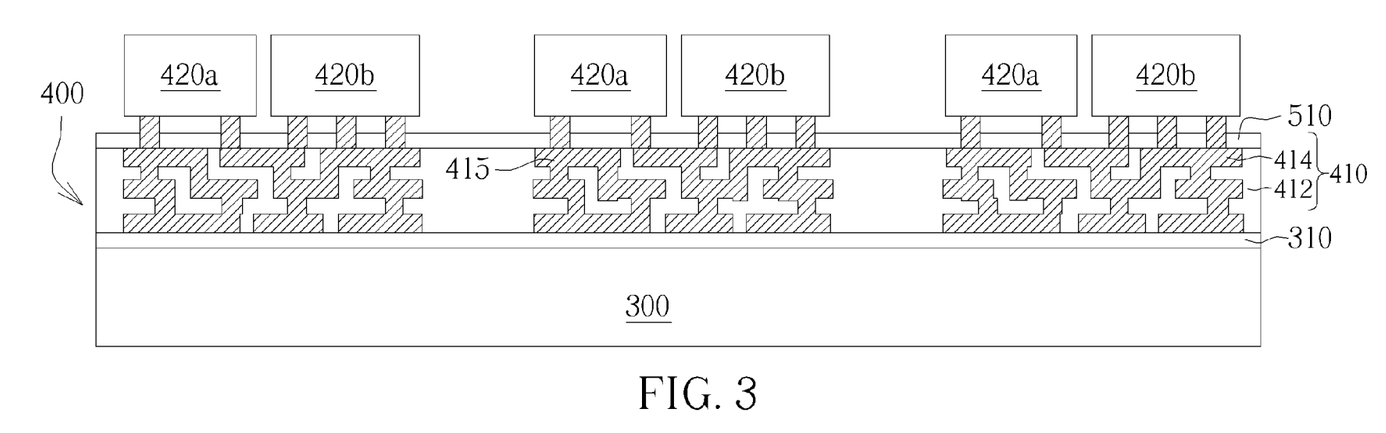

As shown in FIG. 3, after the formation of the bumps 416, individual flip-chips or dies 420a and 420b with their active sides facing down toward the RDL interposer 400 are then mounted on the RDL interposer 400 through the bumps 416 to thereby forming a stacked chip-to-wafer (C2 W) construction.

These individual flip-chips or dies 420a and 420b are active integrated circuit chips with certain functions, for example, GPU (graphic processing unit), CPU (central processing unit), memory chips, etc. According to the embodiment, the die 420a and the die 420b may be together disposed in one package and may be different chips with their specific functions.

Optionally, an underfill (not shown) may be applied under each die 420a or 420b. Optionally, a thermal process may be performed to reflow the bumps 416.

Figure 4:
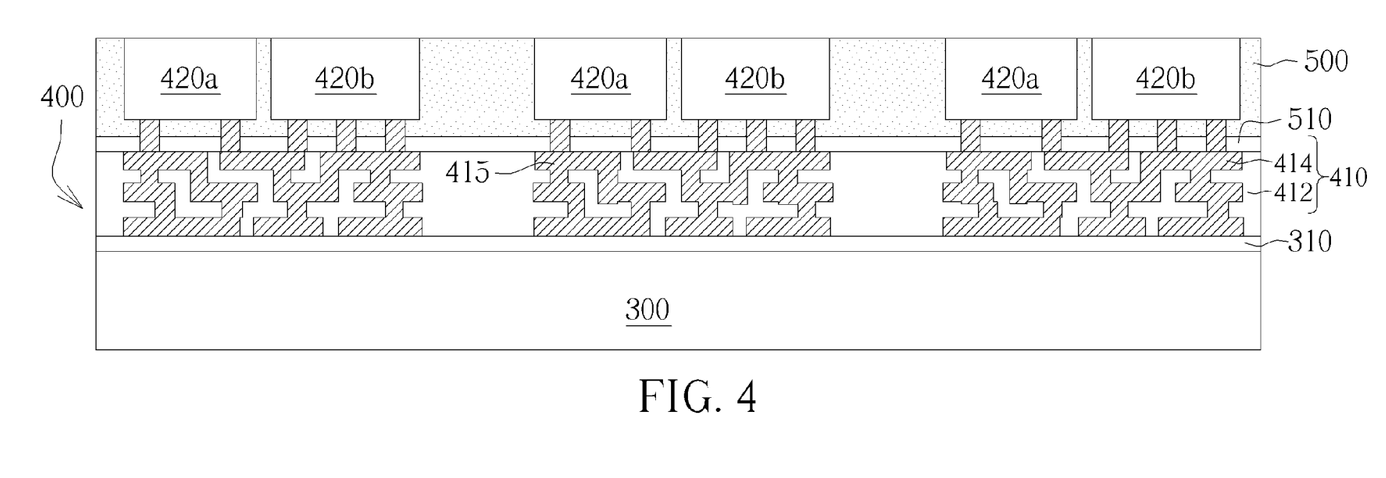

As shown in FIG. 4, after the die-bonding process, a first molding compound 500 is applied. The first molding compound 500 covers the attached dies 420a and dies 420b, and the top surface of the passivation layer 510. Subsequently, the first molding compound 500 may be subjected to a curing process. According to the embodiment, the first mold compound 500 may comprise a mixture of epoxy and silica fillers, but not limited thereto. Optionally, an upper portion of the first molding compound 500 may be polished away to expose top surfaces of the dies 420a and the dies 420b.

Figure 5:
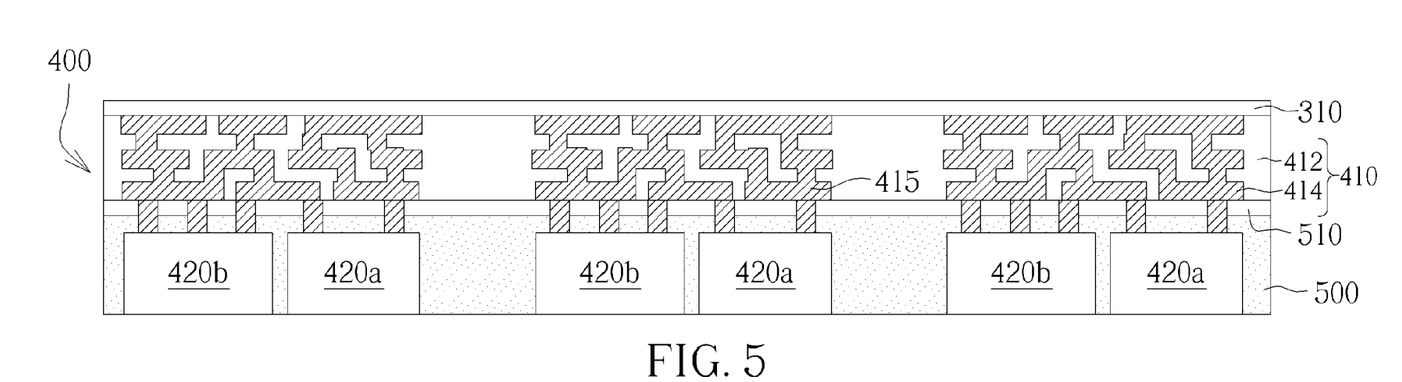

As shown in FIG. 5, after the formation of the first molding compound 500, the carrier 300 is removed or peeled off to expose a lower surface of the passivation layer 310. The de-bonding of the carrier 300 may be performed by using a laser process or UV irradiation process, but not limited thereto.

Figure 6:
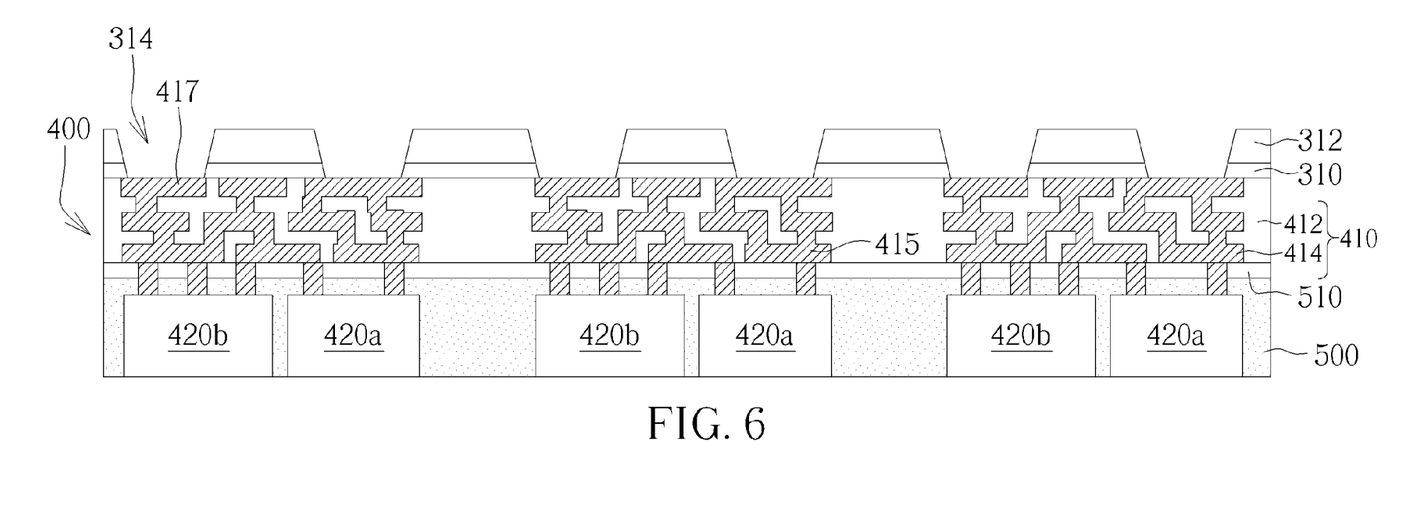

As shown in FIG. 6, after the de-bonding of the carrier 300, a solder mask 312 may be formed on the passivation layer 310. A photographic process may be performed to form openings 314 in the solder mask 312 and the passivation layer 310 to expose respective solder pads 417 in the metal layer 414 of the RDL layer 410.

Figure 7:
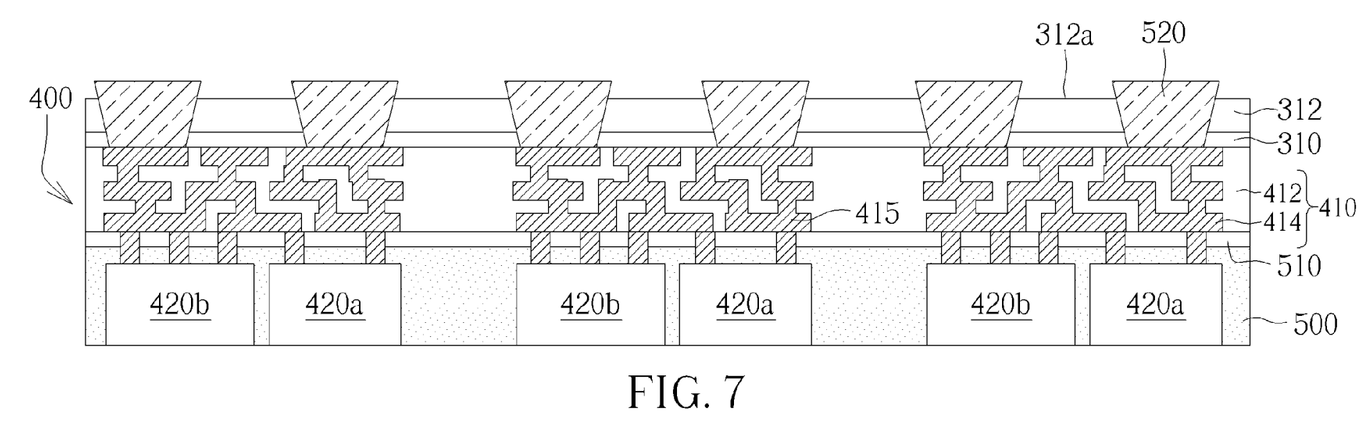

As shown in FIG. 7, solder bumps 520 are formed on the respective solder pads 417. Although not explicitly shown in the figures, it is understood that the solder bumps 520 may be formed on a UBM layer. The formation of the solder bumps 520 are well-known in the art and therefore those details are omitted herein in the interest of brevity. For example, the solder bumps 520 may be formed by plating, screen-printing, ball drop methods, or any suitable methods known in the art.

Figure 8:
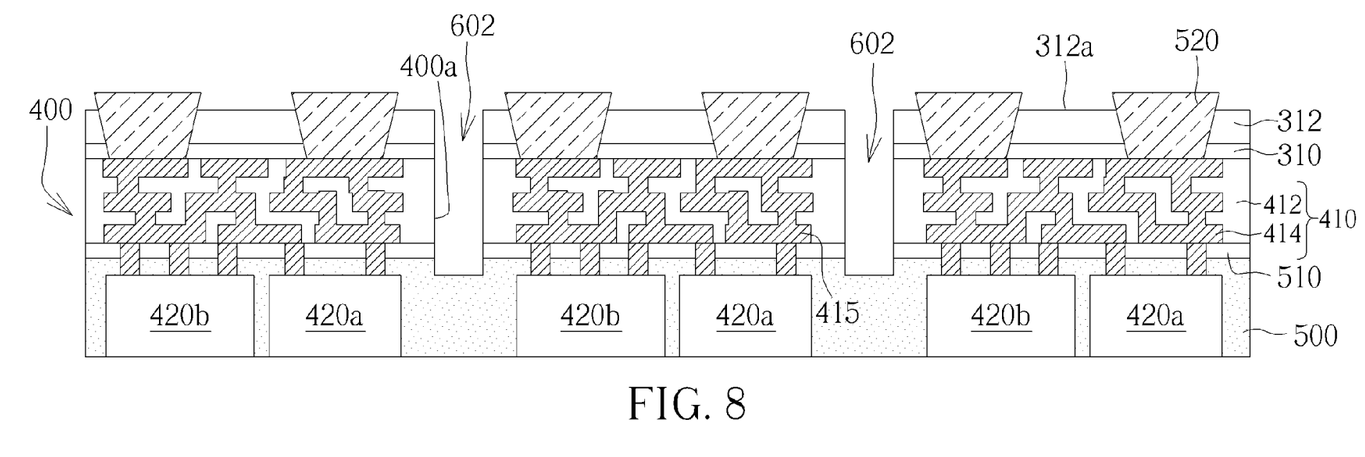

As shown in FIG. 8, after the formation of the solder bumps 520, a sawing or cutting process is performed to form cut trenches 602 into the solder mask 312, the RDL interposer 400, and extending slightly into the first molding compound 500 along the wafer dicing lines (or saw streets). The cut trench 602 does not penetrate through the entire thickness of the first molding compound 500. At this point, a vertical sidewall 400a of the RDL interposer 400 is exposed within each of the cut trenches 602. According to the embodiment, the cut trenches 602 may be formed by using a dicing blade or a laser, but is not limited thereto.

Figure 9:
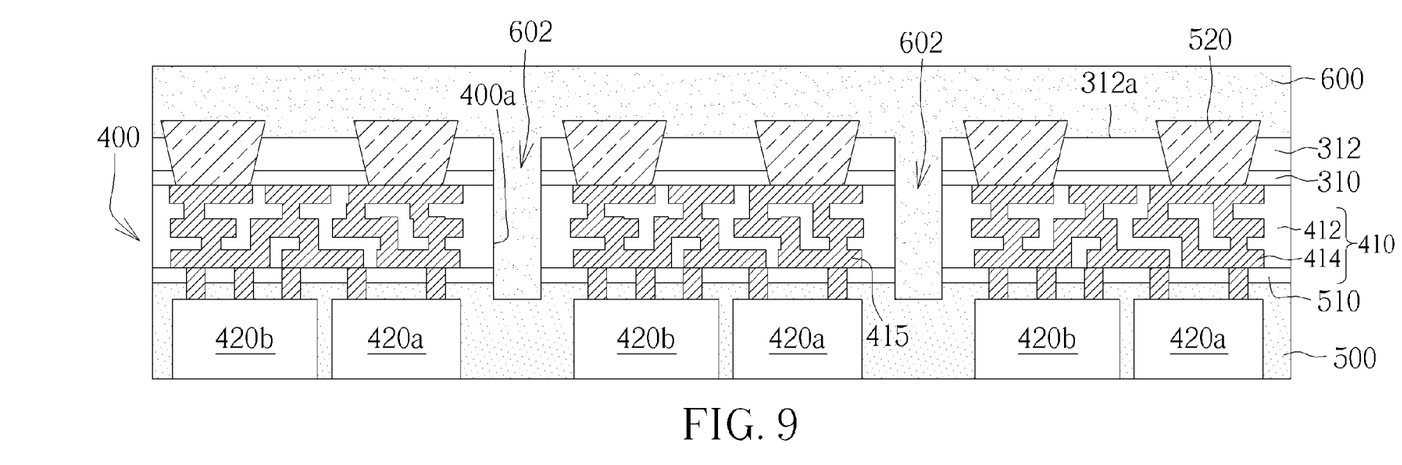

As shown in FIG. 9, after the formation of the cut trenches 602, a second molding compound 600 is formed to fill into the cut trenches 602 and encapsulate the solder bumps 520. The second molding compound 600 also covers the top surface of the solder mask 312. The vertical sidewall 400a of the RDL interposer 400 is covered with the second molding compound 600. Optionally, the second molding compound 600 may be subjected to a curing process. The second molding compound 600 may comprise a mixture of epoxy and silica fillers, but not limited thereto.

According to the embodiment, the second molding compound 600 may have a composition that is different from the first molding compound 500. For example, the second molding compound 600 may be cured at a temperature that does not affect the integrity of the first molding compound 500 and other components previously formed on the RDL interposer 400.

Figure 10:
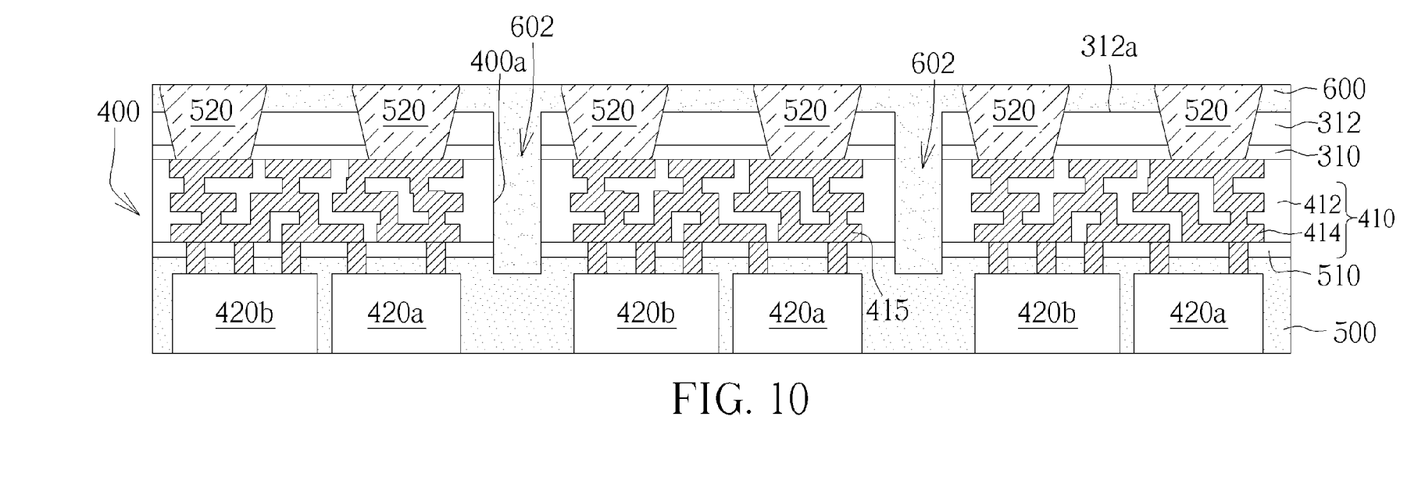

Subsequently, as shown in FIG. 10, a grinding process or a polishing process such as a chemical mechanical polishing (CMP) process is carried out to remove an upper portion of the second molding compound 600 until the solder bumps 520 are exposed. According to the embodiment, during the CMP process, upper portions of the solder bumps 520 may also be removed. At this point, the top surface of the solder bumps 520 may be flush with a top surface of the second molding compound 600.

Figure 11:
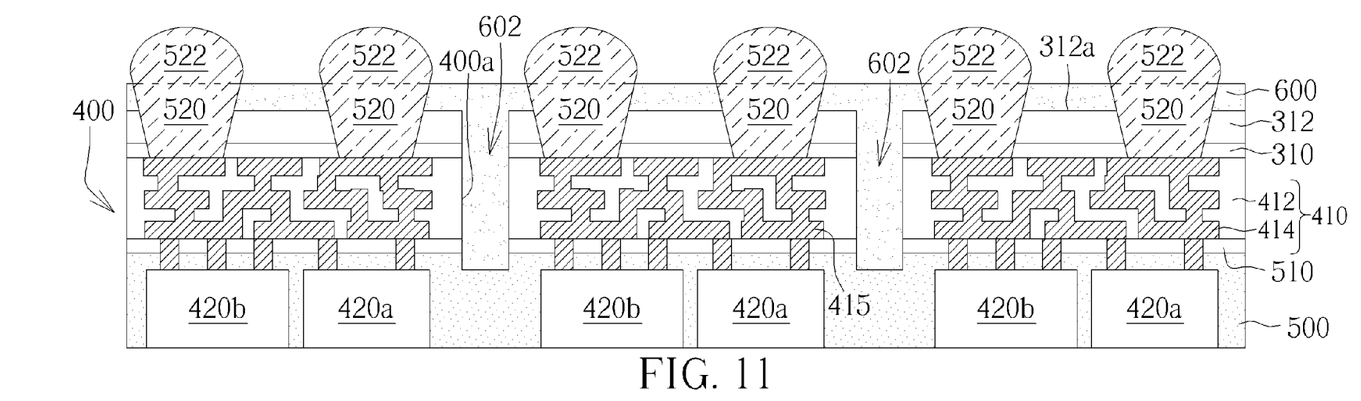

As shown in FIG. 11, bumps 522 are then formed on the exposed top surfaces of the solder bumps 520 such that the bumps 522 protrude from the top surface of the second molding compound 600 for further connections. According to the embodiment, the bumps 522 may be formed by using methods known in the art, for example, plating or screen-printing, bur is not limited thereto.

Figure 12:
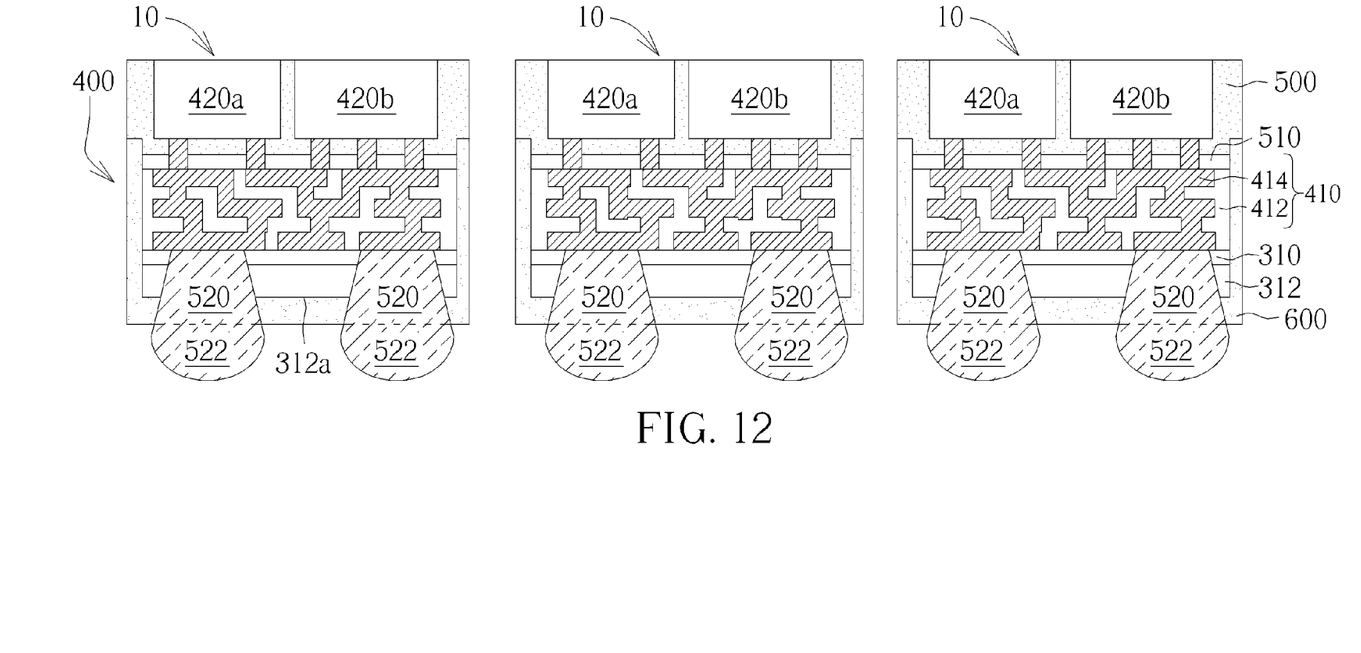

As shown in FIG. 12, a wafer dicing process is then performed to separate individual semiconductor packages 10 from one another. It is understood that in some embodiment each semiconductor package 10 may contain single die. It is one structural feature that the first molding compound 500 is in direct contact with the second molding compound 600. It is another structural feature that the second molding compound 600 is in direct contact with the vertical sidewall of the RDL interposer 400, and the solder bumps 520.

It is advantageous to use the present invention as described above because the vertical sidewall 400a of the RDL interposer 400 is protected by the second molding compound 600. Therefore, the cracking or delamination of the RDL interposer 400 may be effectively avoided. The reliability of the wafer level packages 10 is significantly improved. Further, the second molding compound 600 may counteract the warping induced by the first molding compound 500.

FIG. 13 to FIG. 22 are schematic diagrams showing an exemplary method (or an RDL-last process) for fabricating a semiconductor package with double side molding to encapsulate the RDL interposer according to another embodiment of the invention, wherein like numeral numbers designate like regions, layers or elements.

Figure 13:
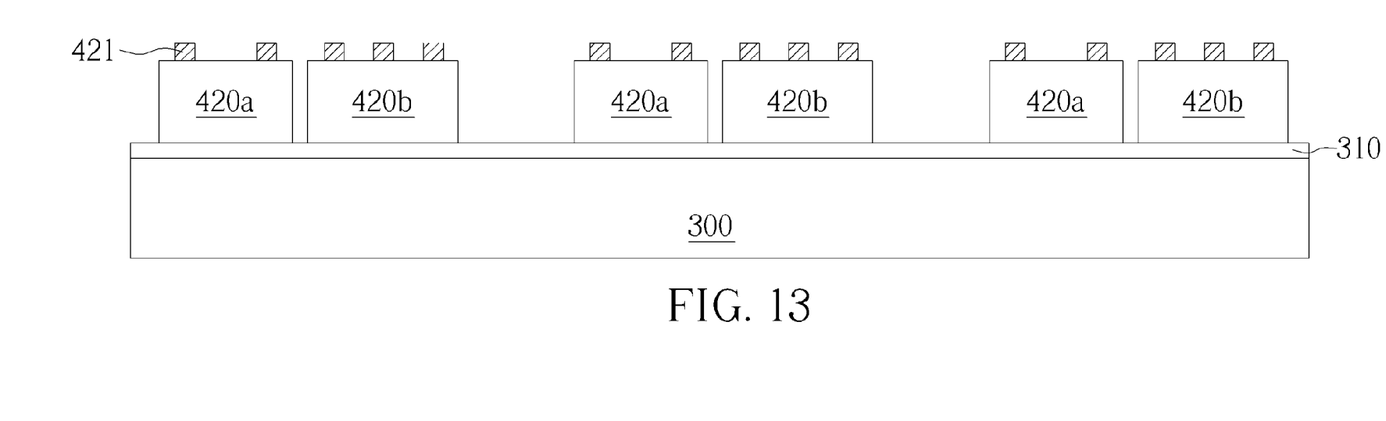
FIG. 13 to FIG. 22 are schematic diagrams showing an exemplary method for fabricating a semiconductor package with double side molding to encapsulate the RDL interposer according to another embodiment of the invention.

As shown in FIG. 13, a carrier 300 is prepared. The carrier 300 may be a releasable substrate material with an adhesive layer 301. Individual chips or dies 420a and 420b with their passive sides facing down toward the carrier 300 are then mounted on the adhesive layer 301. According to the embodiment, each of the dies 420a and 420b have contacts 421 distributed on their respective active surfaces.

Figure 14:
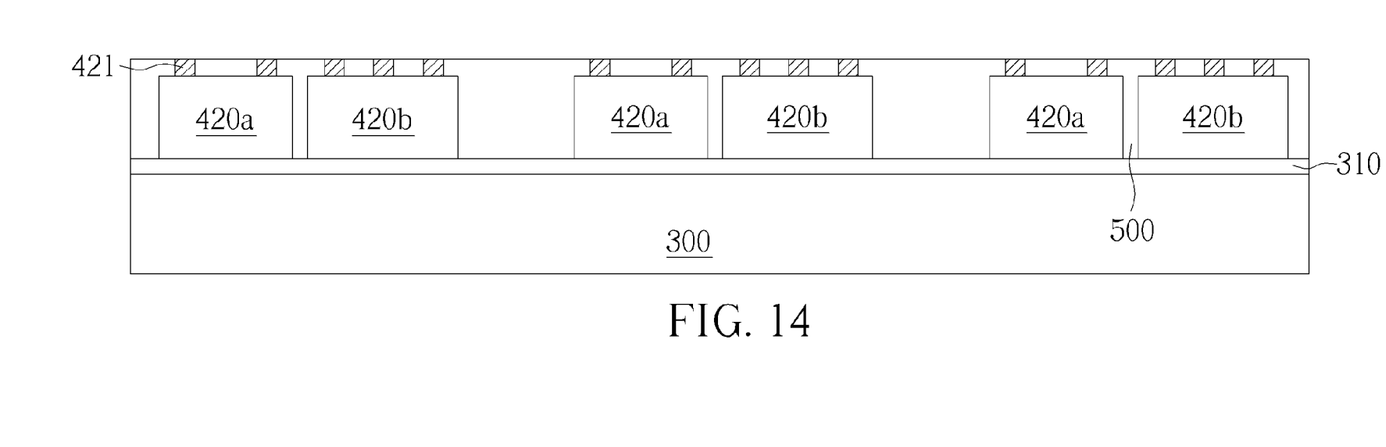

As shown in FIG. 14, a first molding compound 500 is applied. The first molding compound 500 covers the attached dies 420a and dies 420b, and the top surface of the adhesive layer 301. Subsequently, the first molding compound 500 may be subjected to a curing process. According to the embodiment, the first mold compound 500 may comprise a mixture of epoxy and silica fillers, but not limited thereto. Optionally, an upper portion of the first molding compound 500 may be polished away.

Figure 15:
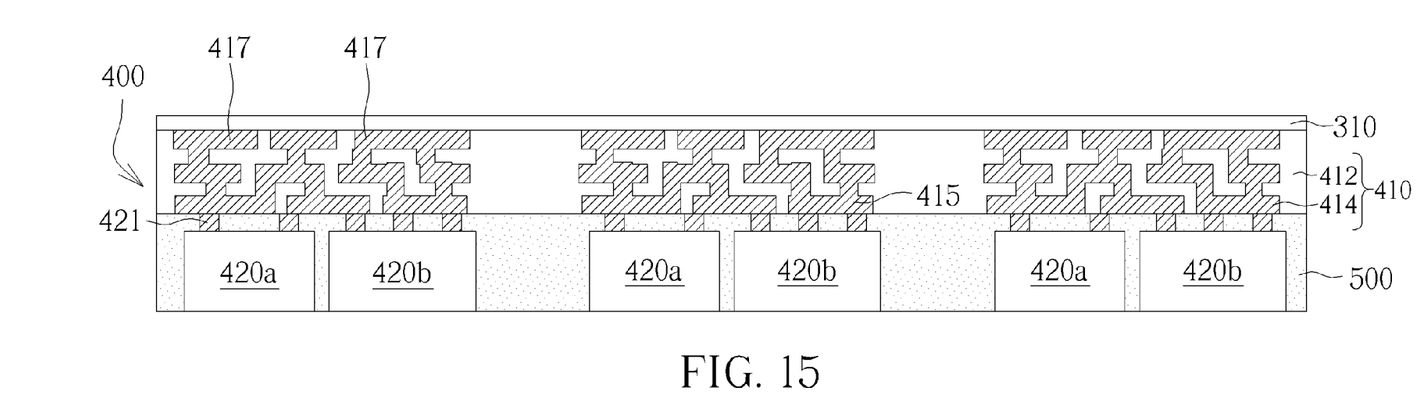

As shown in FIG. 15, a redistribution layer (RDL) layer 410 is formed on the first molding compound 500. The RDL layer 410 may comprise at least one dielectric layer 412 and at least one metal layer 414. The dielectric layer 412 may comprise organic materials such as polyimide (PI) or inorganic materials such as silicon nitride, silicon oxide or the like, but not limited thereto. The metal layer 414 may comprise aluminum, copper, tungsten, titanium, titanium nitride, or the like. According to the illustrated embodiment, the metal layer 414 may comprise a plurality of solder pads 417 exposed from a top surface of the dielectric layer 412. A passivation layer 310 is formed on the RDL layer 410.

According to the embodiment, the RDL layer 410 and the passivation layer 310 are collectively referred to as an RDL interposer 400.

Subsequently, the carrier 300 and the adhesive layer 301 are removed to expose the passive surfaces of the dies 420a and 420b, and the lower surface of the first molding compound 500.

Figure 16:
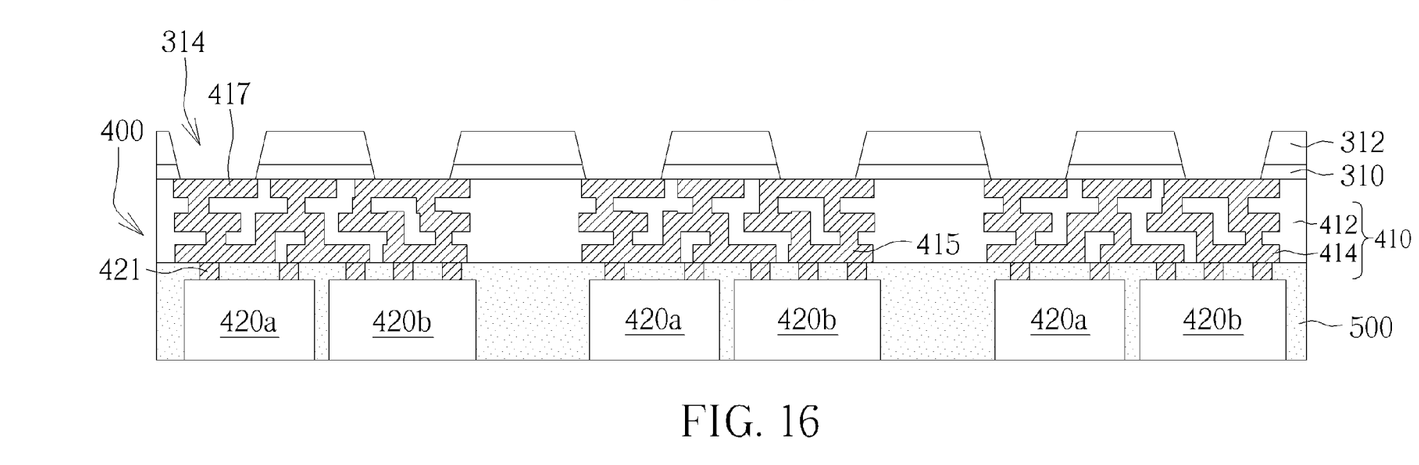

As shown in FIG. 16, after the de-bonding of the carrier 300, a solder mask 312 may be formed on the passivation layer 310. A photographic process may be performed to form openings 314 in the solder mask 312 and the passivation layer 310 to expose respective solder pads 417 in the metal layer 414 of the RDL layer 410.

Figure 17:
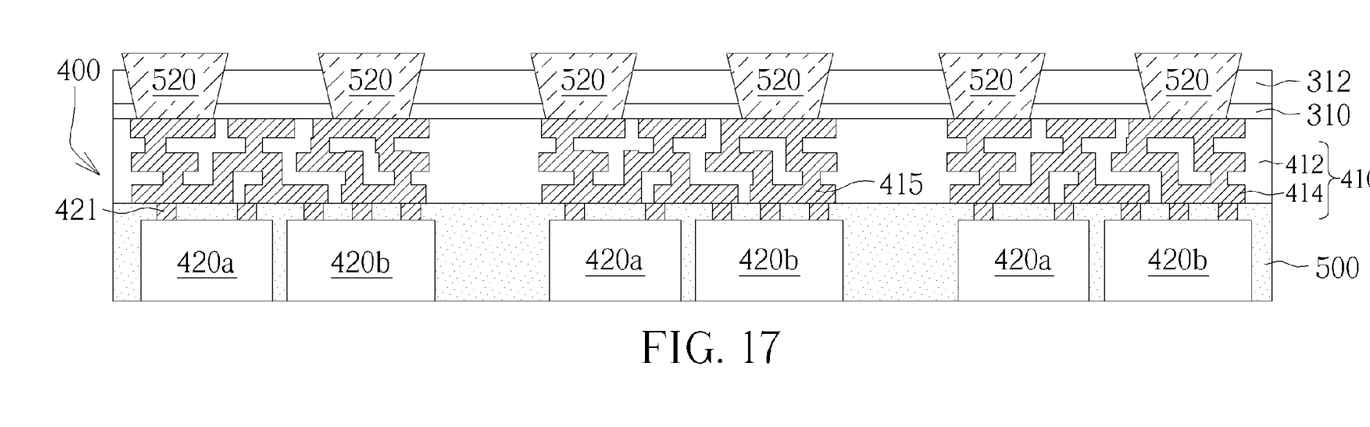

As shown in FIG. 17, solder bumps 520 are formed on the respective solder pads 417. Although not explicitly shown in the figures, it is understood that the solder bumps 520 may be formed on a UBM layer. The formation of the solder bumps 520 are well-known in the art and therefore those details are omitted herein in the interest of brevity. For example, the solder bumps 520 may be formed by plating, screen-printing, ball drop methods, or any suitable methods known in the art.

Figure 18:
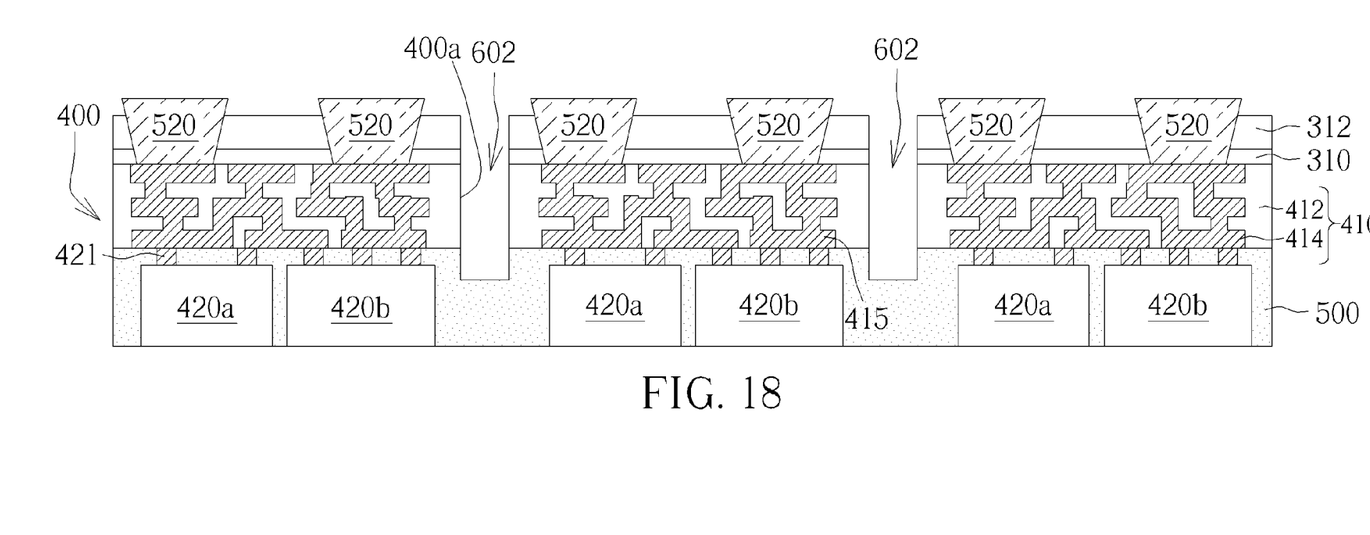

As shown in FIG. 18, after the formation of the solder bumps 520, a sawing or cutting process is performed to form cut trenches 602 into the solder mask 312, the RDL interposer 400, and extending slightly into the first molding compound 500 along the wafer dicing lines (or saw streets). The cut trench 602 does not penetrate through the entire thickness of the first molding compound 500. At this point, a vertical sidewall 400a of the RDL interposer 400 is exposed within each of the cut trenches 602. According to the embodiment, the cut trenches 602 may be formed by using a dicing blade or a laser, but is not limited thereto.

Figure 19:
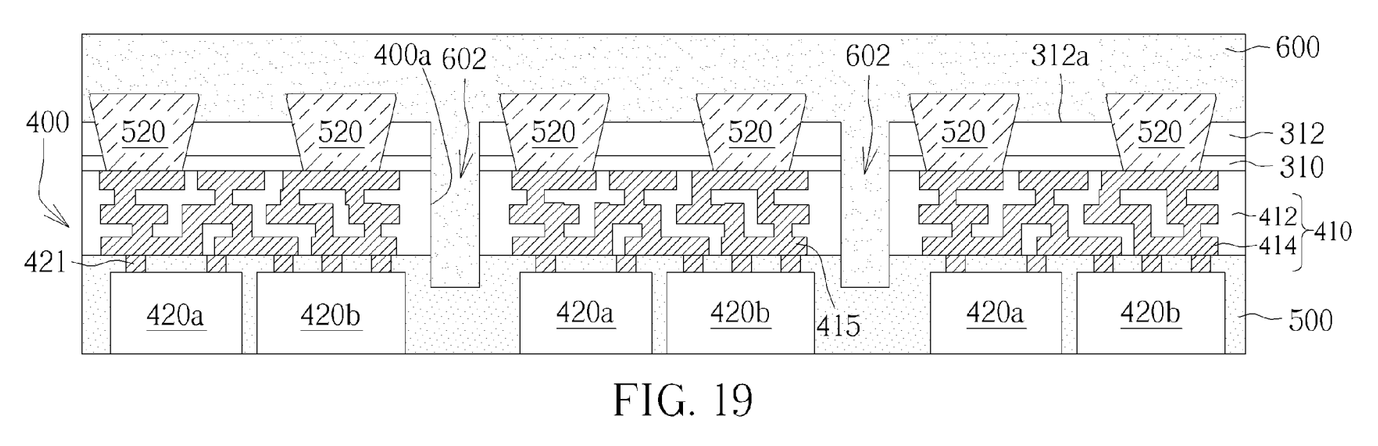

As shown in FIG. 19, after the formation of the cut trenches 602, a second molding compound 600 is formed to fill into the cut trenches 602 and encapsulate the solder bumps 520. The second molding compound 600 also covers the top surface of the solder mask 312. The vertical sidewall 400a of the RDL interposer 400 is covered with the second molding compound 600. The second molding compound 600 may be subjected to a curing process. The second molding compound 600 may comprise a mixture of epoxy and silica fillers, but not limited thereto.

According to the embodiment, the second molding compound 600 may have a composition that is different from the first molding compound 500. For example, the second molding compound 600 may be cured at a temperature that does not affect the integrity of the first molding compound 500 and other components previously formed on the RDL interposer 400.

Figure 20:
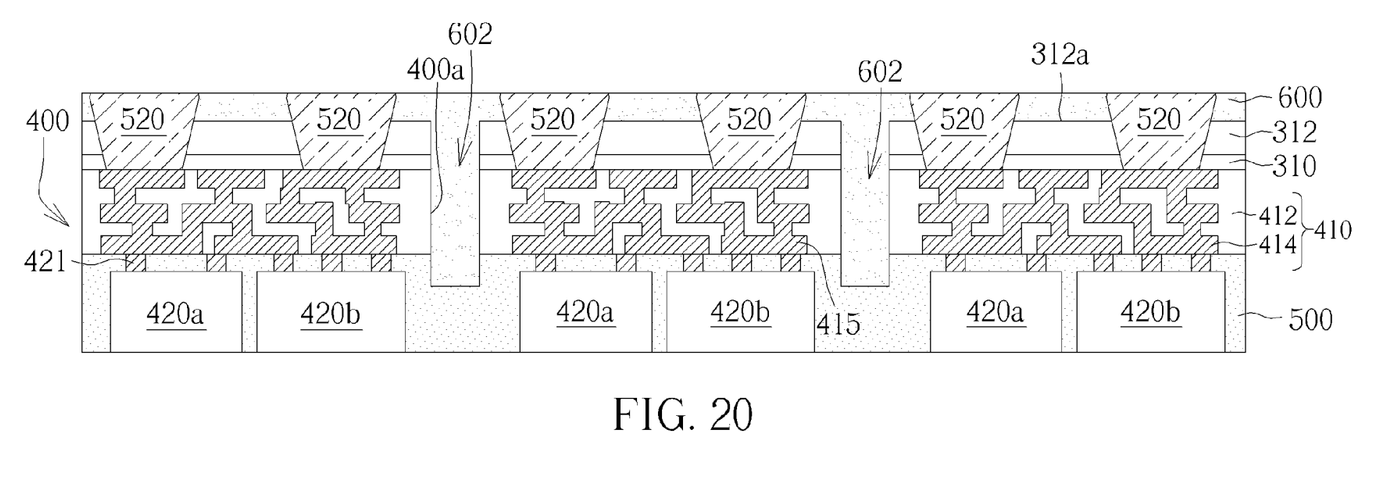

Subsequently, as shown in FIG. 20, a grinding process or a polishing process such as a chemical mechanical polishing (CMP) process is carried out to remove an upper portion of the second molding compound 600 until the solder bumps 520 are exposed. According to the embodiment, during the CMP process, upper portions of the solder bumps 520 may also be removed. At this point, the top surface of the solder bumps 520 may be flush with a top surface of the second molding compound 600.

Figure 21:
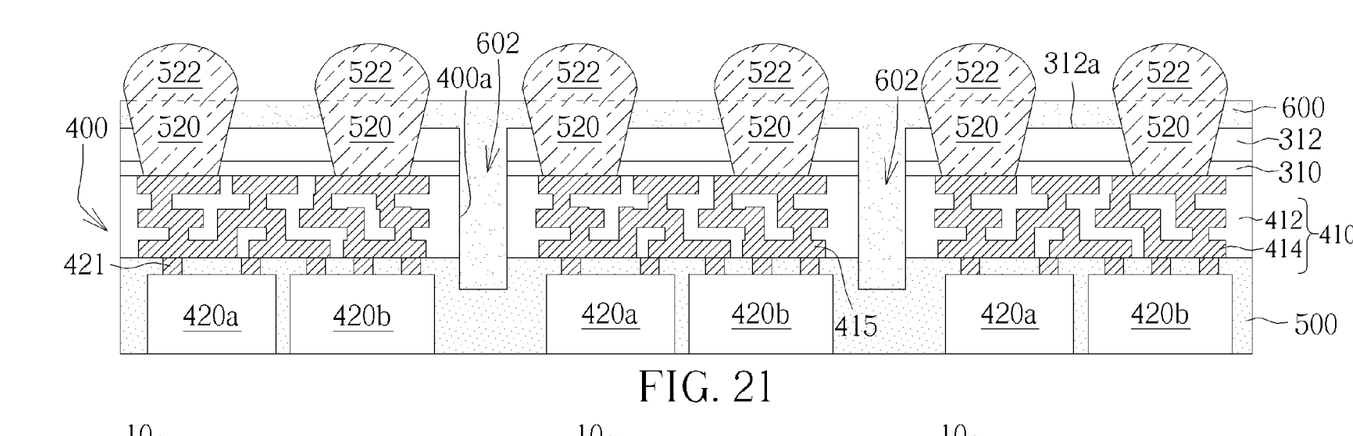

As shown in FIG. 21, bumps 522 are then formed on the exposed top surfaces of the solder bumps 520 such that the bumps 522 protrude from the top surface of the second molding compound 600 for further connections. According to the embodiment, the bumps 522 may be formed by using methods known in the art, for example, plating or screen-printing, bur is not limited thereto.

Figure 22:
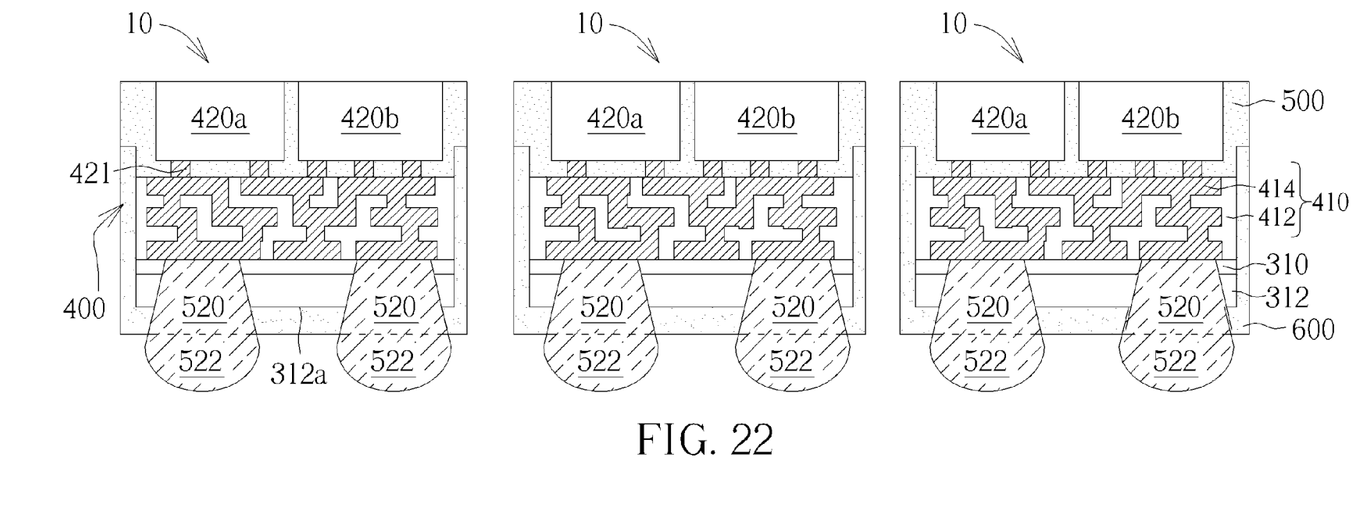

As shown in FIG. 22, a wafer dicing process is then performed to separate individual semiconductor packages 10 from one another. It is one structural feature that the semiconductor packages 10 has double side molding including the first molding compound 500 indirect contact with the second molding compound 600. It is another structural feature that the second molding compound 600 is in direct contact with the vertical sidewall of the RDL interposer 400, and the solder bumps 520.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor package, comprising:
   a redistributed layer (RDL) interposer having a first side, a second side opposite to the first side, and a vertical sidewall extending between the first side and the second side;
   at least one semiconductor die mounted on the first side of the RDL interposer;
   a first molding compound disposed on the first side, the first molding compound covering the at least one semiconductor die;
   a plurality of solder bumps mounted on the second side; and
   a second molding compound disposed on the second side, the second molding compound surrounding the plurality of solder bumps and covering the vertical sidewall of the RDL interposer, wherein the first molding compound and the second molding compound have different composition, wherein the second molding compound comprises a peripheral portion extending into the first molding compound and clamping the first molding compound.

2. The semiconductor package according to claim 1, wherein the first molding compound is in direct contact with the second molding compound.

3. The semiconductor package according to claim 1 further comprising bumps directly disposed on respective said plurality of solder bumps such that said bumps protrude from a top surface of the second molding compound.

4. The semiconductor package according to claim 1, wherein the RDL interposer comprises an RDL layer comprising at least one dielectric layer and at least one metal layer.

5. The semiconductor package according to claim 4, wherein the dielectric layer comprises polyimide, silicon nitride, or silicon oxide.

6. The semiconductor package according to claim 4, wherein the metal layer comprises aluminum, copper, tungsten, titanium, or titanium nitride.

7. The semiconductor package according to claim 4, wherein the RDL interposer further comprises a passivation layer laminated on the dielectric layer.

8. The semiconductor package according to claim 1, wherein the first molding compound is polished away from an upper portion of the semiconductor die to expose a top surface of semiconductor die.

* * * * *

UNITED STATES PATENT AND TRADEMARK OFFICE
CERTIFICATE OF CORRECTION

PATENT NO. : 9,613,895 B1  
APPLICATION NO. : 15/060577  
DATED : April 4, 2017  
INVENTOR(S) : Shing-Yih Shih

Page 1 of 1

It is certified that error appears in the above-identified patent and that said Letters Patent is hereby corrected as shown below:

In the Specification

| | | |
|---|---|---|
| Column 2, | Line 30, | change "constitute apart of this" to --constitute a part of this-- |
| Column 3, | Line 62, | change "(C2 W)" to --(C2W)-- |
| Column 7, | Line 5, | change "500 indirect contact" to --500 in direct contact-- |

Signed and Sealed this  
Fifth Day of September, 2017

Joseph Matal  
*Performing the Functions and Duties of the*  
*Under Secretary of Commerce for Intellectual Property and*  
*Director of the United States Patent and Trademark Office*